(12) United States Patent
Wang et al.

(10) Patent No.: US 11,901,369 B2
(45) Date of Patent: Feb. 13, 2024

(54) PIXEL ARRAY SUBSTRATE

(71) Applicant: Au Optronics Corporation, Hsinchu (TW)

(72) Inventors: Mu-Kai Wang, Hsinchu (TW); Ai-Ju Tsai, Hsinchu (TW); Kuo-Yu Huang, Hsinchu (TW); Yueh-Hung Chung, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 406 days.

(21) Appl. No.: 17/385,917

(22) Filed: Jul. 27, 2021

(65) Prior Publication Data
US 2022/0059573 A1 Feb. 24, 2022

Related U.S. Application Data

(60) Provisional application No. 63/068,480, filed on Aug. 21, 2020.

(30) Foreign Application Priority Data

Mar. 2, 2021 (TW) .................................. 110107205

(51) Int. Cl.
*H01L 27/12* (2006.01)
(52) U.S. Cl.
CPC .................................. *H01L 27/124* (2013.01)
(58) Field of Classification Search
CPC ......... G02F 1/136263; G02F 1/136259; H01L 27/124
See application file for complete search history.

(56) References Cited

U.S. PATENT DOCUMENTS

| 10,424,603 | B2 | 9/2019 | Lee et al. | |
|---|---|---|---|---|
| 2014/0043306 | A1* | 2/2014 | Min | G09G 3/3677 345/204 |
| 2015/0115292 | A1* | 4/2015 | Jeon | H01L 27/124 257/88 |

(Continued)

FOREIGN PATENT DOCUMENTS

| CN | 108563081 | 9/2018 |
|---|---|---|
| CN | 109192121 | 1/2019 |

(Continued)

*Primary Examiner* — James A Dudek
(74) *Attorney, Agent, or Firm* — JCIPRNET

(57) ABSTRACT

A pixel array substrate, including multiple pixel structures, multiple data lines, multiple scan line groups, multiple transfer line groups, multiple connection terminal groups, and multiple bridge line groups, is provided. The multiple data lines are electrically connected to the multiple pixel structures and arranged in a first direction. Each scan line group includes multiple scan lines arranged in a second direction. The multiple scan lines of the multiple scan line groups are electrically connected to the multiple pixel structures. Each transfer line group includes multiple transfer lines arranged in the first direction. The multiple transfer lines of each transfer line group are electrically connected to the multiple scan lines of a corresponding scan line group. The bridge line groups are structurally separated. Each bridge line group is electrically connected to a corresponding transfer line group and a corresponding connection terminal group.

20 Claims, 7 Drawing Sheets

(56) References Cited

U.S. PATENT DOCUMENTS

| | | | | |
|---|---|---|---|---|
| 2019/0252411 A1* | 8/2019 | Lee | ...................... | H01L 27/124 |
| 2019/0265566 A1* | 8/2019 | Nakagawa | ........ | G02F 1/136286 |
| 2021/0057450 A1 | 2/2021 | Wu et al. | | |
| 2021/0116764 A1 | 4/2021 | Lin et al. | | |
| 2021/0318583 A1* | 10/2021 | Shin | ...................... | G02F 1/1368 |

FOREIGN PATENT DOCUMENTS

| | | |
|---|---|---|
| CN | 111338141 | 6/2020 |
| CN | 111708233 | 9/2020 |

\* cited by examiner

PIXEL ARRAY SUBSTRATE

CROSS-REFERENCE TO RELATED APPLICATION

This application claims the priority benefit of U.S. provisional application Ser. No. 63/068,480, filed on Aug. 21, 2020 and Taiwan application serial no. 110107205, filed on Mar. 2, 2021. The entirety of the abovementioned patent applications are hereby incorporated by reference herein and made a part of this specification.

BACKGROUND

Technical Field

This disclosure relates to a pixel array substrate.

Description of Related Art

With the development of display technology, optical characteristics such as high resolution, high contrast, and a wide viewing angle are no longer able to satisfy consumers who have demands for a display device. Consumers now also expect the display device to have an elegant appearance. For example, consumers expect the display device to have a narrow frame or even no frame.

In general, a display device includes multiple pixel structures disposed in an active region, a data driving circuit disposed above or below the active region, and a gate driving circuit disposed on left, right, or left and right sides of the active region. In order to reduce widths of the left and right sides of the frame of the display device, multiple connection terminals configured to electrically connect to the gate driving circuit may be disposed above the active region. When the connection terminal is disposed above the active region, a scan line extending in the horizontal direction have to be electrically connected to the connection terminal through a transfer line extending in the vertical direction. However, when the transfer line is disposed in the active region, the transfer line has to inevitably be adjacent to a data line. The coupling effect between the transfer line and the data line causes a data signal on the data line to shift, thereby causing diagonal stripes.

SUMMARY

This disclosure provides a pixel array substrate with good performance and short development time.

This disclosure provides another pixel array substrate with good performance and short development time.

This disclosure provides yet another pixel array substrate with good performance and short development time.

The pixel array substrate according to an embodiment of the disclosure includes a base, multiple pixel structures, multiple data lines, multiple scan line groups, multiple transfer line groups, multiple connection terminal groups, multiple bridge line groups, and an insulation layer. The base has an active region and a first peripheral region outside of the active region. The multiple pixel structures are disposed at the active region of the base. The multiple data lines are electrically connected to the multiple pixel structures, and are arranged in a first direction. Each of the scan line groups includes multiple scan lines, the multiple scan lines are arranged in a second direction, the first direction and the second direction are staggered, and the multiple scan lines of the multiple scan line groups are electrically connected to the multiple pixel structures. Each of the transfer line groups includes multiple transfer lines, and the multiple transfer lines are arranged in the first direction and are electrically connected to the multiple scan lines of a corresponding scan line group. The multiple connection terminal groups are disposed on the first peripheral region of the base. Each of the connection terminal groups includes multiple connection terminals. The multiple bridge line groups are disposed on the base and are structurally separated from each other. Each of the bridge line groups is electrically connected to a corresponding transfer line group and a corresponding connection terminal group. Each of the bridge line group includes multiple first bridge lines extending in the first direction and multiple second bridge lines extending in the second direction. The insulation layer is disposed in between the multiple first bridge lines and the multiple second bridge lines of each of the bridge line groups. The multiple second bridge lines of each of the bridge line groups are electrically connected to the multiple first bridge lines through multiple first contact windows of the insulation layer. The multiple transfer lines of each of the transfer line groups are electrically connected to the multiple first bridge lines of a corresponding bridge line group through multiple second contact windows of the insulation layer. The connection terminal group, the bridge line group, and the transfer line group corresponding to each other are electrically connected through the multiple first contact windows and the multiple second contact windows of the insulation layer. Two of the multiple first contact windows and the multiple second contact windows with a furthest distance in the first direction have a first distance in-between, and a length of each of the first bridge lines of the bridge line group is greater than or equal to the first distance. The multiple connection terminals of the connection terminal group include a first connection terminal to an n-th connection terminal sequentially arranged in the first direction, where n is a positive integer greater than or equal to 2. The multiple transfer lines of the transfer line group include a first transfer line to an n-th transfer line respectively electrically connected to the first connection terminal to the n-th connection terminal. An arrangement sequence of the first connection terminal to the n-th connection terminal in the first direction is different from an arrangement sequence of the first transfer line to the n-th transfer line in the first direction.

A pixel array substrate according to another embodiment of the disclosure includes a base, multiple pixel structures, multiple data lines, multiple scan line groups, multiple transfer line groups, multiple connection terminal groups, and multiple bridge line groups. The base has an active region and a first peripheral region outside of the active region. The multiple pixel structures are disposed at the active region of the base. The multiple data lines are electrically connected to the multiple pixel structures, and are arranged in a first direction. Each of the scan line groups includes multiple scan lines, the multiple scan lines are arranged in a second direction, the first direction and the second direction are staggered, and the multiple scan lines of the multiple scan line groups are electrically connected to the multiple pixel structures. Each of the transfer line groups includes multiple transfer lines, and the multiple transfer lines are arranged in the first direction and are electrically connected to the multiple scan lines of a corresponding scan line group. The multiple connection terminal groups are disposed on the first peripheral region of the base. Each of the connection terminal groups includes multiple connection terminals. The multiple bridge line groups are disposed on the base and are structurally separated from each other. Each of the bridge line groups is electrically connected to a corresponding transfer line group and a corresponding connection terminal group. The multiple connection terminals of each of the connection terminal groups include a first connection terminal to an n-th connection terminal sequentially arranged in the first direction, where n is a positive integer greater than or equal to 2. The multiple transfer lines of the transfer line group corresponding to each of the connection terminal groups include a first transfer line to an n-th transfer line respectively electrically connected to the first connection terminal to the n-th connection terminal. An arrangement sequence of the first connection terminal to the n-th connection terminal in the first direction is different from an arrangement sequence of the first transfer line to the n-th transfer line in the first direction. The first connection terminal to the n-th connection terminal of each of the connection terminal groups include a first connecting terminal and a second connecting terminal. The first connecting terminal is electrically connected to a scan line through a second bridge line of a corresponding bridge line group, a first bridge line of the corresponding bridge line group, and a corresponding transfer line. A sum of a number of other first bridge lines of the corresponding bridge line group that the second bridge line crosses, a number of intersection between the second bridge line and the first bridge line, a number of intersection between the first bridge line and the transfer line, and a number of first bridge lines of the corresponding bridge line group that the transfer line crosses is A1. The second connection terminal is electrically connected to another scan line through another second bridge line of the corresponding bridge line group, another first bridge line of the corresponding bridge line group, and another corresponding transfer line. A sum of a number of other first bridge lines of the corresponding bridge line group that the another second bridge line crosses, a number of intersection between the another second bridge line and the another first bridge line, a number of intersection between the another first bridge line and the another transfer line, and a number of first bridge lines of the corresponding bridge line group that the another transfer line crosses is A2. A1 is equal to A2.

A pixel array substrate according to yet another embodiment of the disclosure includes a base, multiple pixel structures, multiple data lines, multiple scan line groups, multiple transfer line groups, multiple connection terminal groups, and multiple bridge line groups. The base has an active region and a first peripheral region outside of the active region. The multiple pixel structures are disposed at the active region of the base. The multiple data lines are electrically connected to the multiple pixel structures, and are arranged in a first direction. Each of the scan line groups includes multiple scan lines, the multiple scan lines are arranged in a second direction, the first direction and the second direction are staggered, and the multiple scan lines of the multiple scan line groups are electrically connected to the multiple pixel structures. Each of the transfer line groups includes multiple transfer lines, and the multiple transfer lines are arranged in the first direction and are electrically connected to the multiple scan lines of a corresponding scan line group. The multiple connection terminal groups are disposed on the first peripheral region of the base. Each of the connection terminal groups includes multiple connection terminals. The multiple bridge line groups are disposed on the base and are structurally separated from each other. Each of the bridge line groups is electrically connected to a corresponding transfer line group and a corresponding connection terminal group. The multiple connection terminals of each of the connection terminal groups include a first connection terminal to an n-th connection terminal sequentially arranged in the first direction, where n is a positive integer greater than or equal to 2. The multiple transfer lines of the transfer line group corresponding to each of the connection terminal groups include a first transfer line to an n-th transfer line respectively electrically connected to the first connection terminal to the n-th connection terminal. An arrangement sequence of the first connection terminal to the n-th connection terminal in the first direction is different from an arrangement sequence of the first transfer line to the n-th transfer line in the first direction. The multiple pixel structures are arranged as multiple pixel rows. The multiple pixel structures of each of the pixel rows are arranged in the first direction. In the top view of the pixel array substrate, the multiple first bridge lines of each of the bridge line groups are respectively disposed corresponding to the multiple pixel rows.

To make the abovementioned more comprehensible, several embodiments accompanied by drawings are described in detail as follows.

DESCRIPTION OF THE EMBODIMENTS

Figure 1:
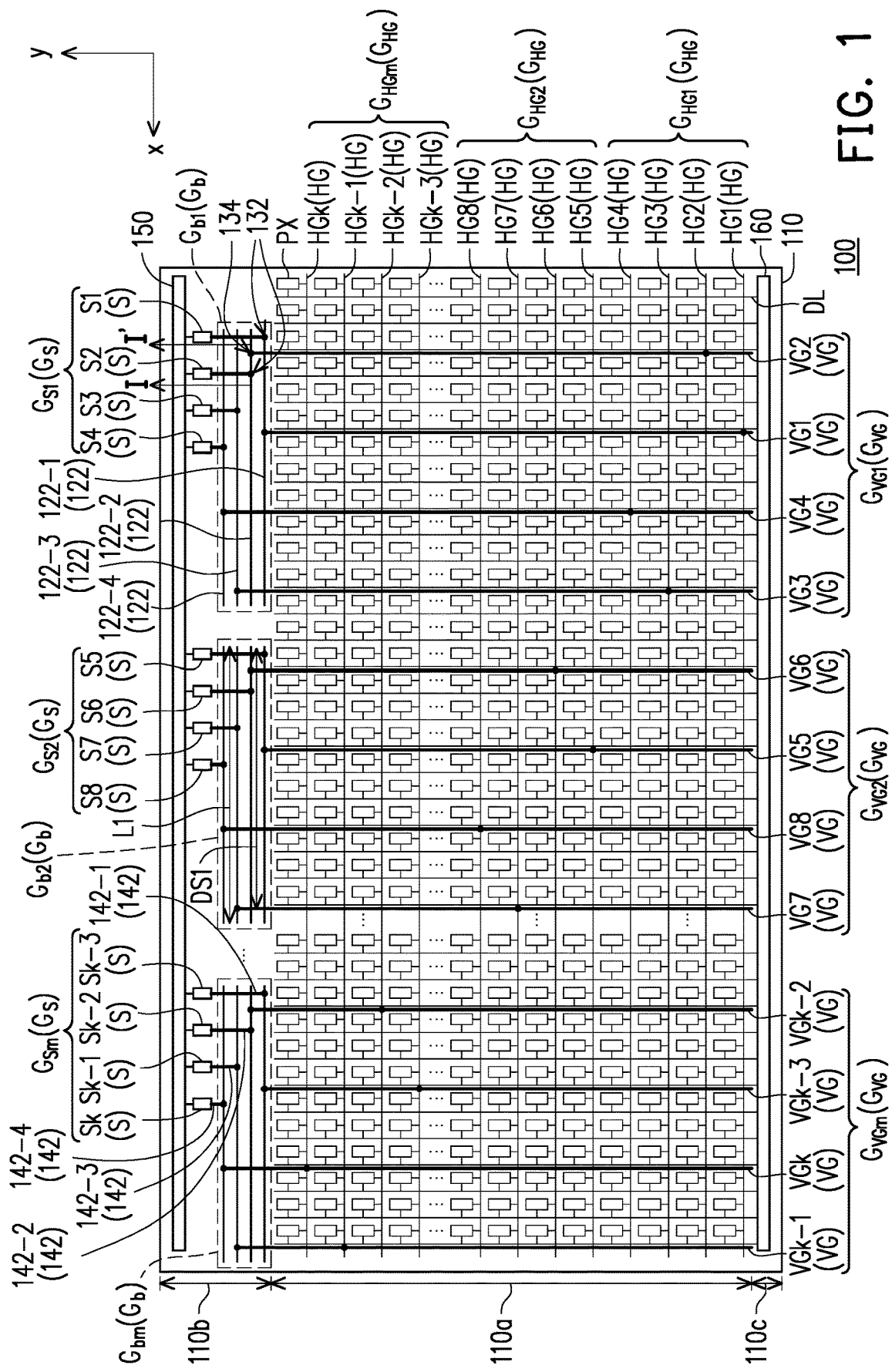
FIG. 1 is a schematic top view of a pixel array substrate 100 according to an embodiment of the disclosure.

Reference is now made in detail to exemplary embodiments of the disclosure, and examples of the exemplary embodiments are illustrated in the accompanying drawings. Whenever possible, the same reference numerals are used in the drawings and descriptions to indicate the same or similar parts.

It should be understood that when an element such as a layer, film, region, or substrate is referred to as being "on" or "connected to" another element, it may be directly on or connected to the other element, or there may also be intermediary elements present. In contrast, when an element is referred to as being "directly on" or "directly connected to" another element, there are no intermediary elements present. As used herein, "connected to" may refer to physical and/or electrical connection. Furthermore, "electrically connected to" or "coupled to" may mean that there are other elements between the two elements.

Unless otherwise defined, all terms (including technical and scientific terms) used herein have the same meaning as commonly understood by those of ordinary skill in the art. It should be further understood that terms such as those defined in commonly used dictionaries should be interpreted as having meanings consistent with their meanings in the context of related technologies and the disclosure, and are not to be interpreted as having meanings that are idealized or excessively formalized, unless explicitly defined as such in the text.

FIG. 1 is a schematic top view of a pixel array substrate 100 according to an embodiment of the disclosure.

Figure 2:
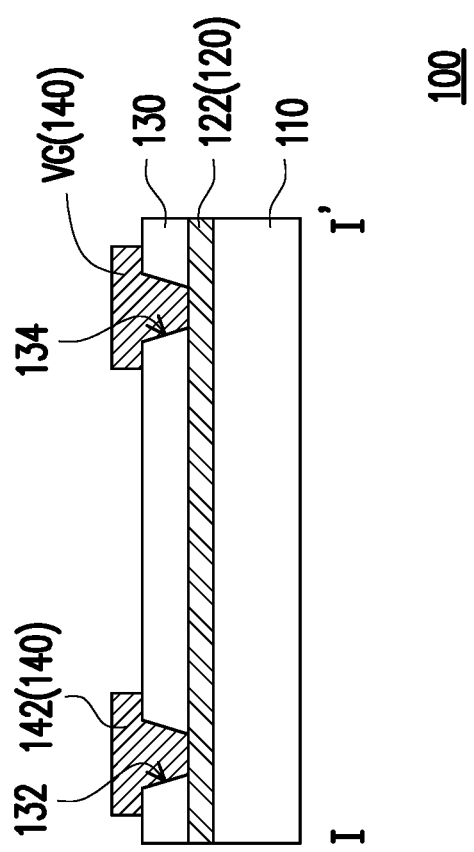
FIG. 2 is a schematic cross-sectional view of the pixel array substrate 100 according to an embodiment of the disclosure.

FIG. 2 is a schematic cross-sectional view of the pixel array substrate 100 according to an embodiment of the disclosure. FIG. 2 corresponds to a section line I-I' in FIG. 1, and shows a first metal layer 120, an insulation layer 130, and a second metal layer 140 of the pixel array substrate 100, with omission of other layers.

With reference to FIGS. 1 and 2, the pixel array substrate 100 includes a base 110. With reference to FIG. 1, the base 110 has an active region 110a and a first peripheral region 110b outside of the active region 110a. In the embodiment, the base 110 may also optionally have a second peripheral region 110c. The first peripheral region 110b and the second peripheral region 110c are respectively disposed on two opposite sides of the active region 110a. In the embodiment, the active region 110a may also be referred to as a display region, the first peripheral region 110b may also be referred to as an upper frame region, and the second peripheral region 110c may also be referred to as a lower frame region, but the disclosure is not limited thereto.

For example, in the embodiment, a material of base 110 may be glass. However, the disclosure is not limited thereto. In other embodiments, a material of the base 110 may also be quartz, an organic polymer, or an opaque/reflective material (for example, wafers, ceramics, etc.), or other applicable materials.

With reference to FIG. 1, the pixel array substrate 100 further includes multiple pixel structure PXs, which are disposed at the active region 110a of the base 110. For example, in the embodiment, each of the pixel structures PX may include a thin film transistor (not shown) and a pixel electrode (not shown). A source electrode (not shown) of the thin film transistor is electrically connected to a corresponding data line DL, a gate electrode (not shown) of the thin film transistor is electrically connected to a corresponding scan line HG, and a drain electrode (not shown) of the thin film transistor is electrically connected to a pixel electrode (not shown).

The pixel array substrate 100 further includes multiple data lines DL, which are electrically connected to the multiple pixel structures PX, and are arranged in a first direction x. Specifically, in the embodiment, the multiple data lines DL are electrically connected to multiple sources (not shown) of multiple thin film transistors (not shown) of the multiple pixel structures PX. For example, in the embodiment, the multiple data lines DL may optionally belong to the second metal layer 140 (marked in FIG. 2), but the disclosure is not limited thereto.

With reference to FIG. 1, the pixel array substrate 100 further includes multiple scan line groups $G_{HG}$. Each of the scan line groups $G_{HG}$ includes multiple scan lines HG arranged in a second direction y, and the first direction x and the second direction y are staggered. In the embodiment, the first direction x and the second direction y may be optionally perpendicular, but the disclosure is not limited thereto.

The multiple scan lines HG of the multiple scan line groups $G_{HG}$ are electrically connected to the multiple pixel structure PXs. Specifically, in the embodiment, the multiple scan lines HG of the multiple scan line groups $G_{HG}$ are electrically connected to multiple gates (not shown) of the multiple thin film transistors (not shown) of the multiple pixel structures PX. For example, in the embodiment, the multiple scan lines HG may optionally belong to the first metal layer 120 (marked in FIG. 2), but the disclosure is not limited thereto.

With reference to FIG. 1, in the embodiment, the multiple scan line groups $G_{HG}$ may include a first scan line group $G_{HG1}$, a second scan line group $G_{HG2}$ to an m-th scan line group $G_{HGm}$ sequentially arranged in the first direction x, where m is a positive integer greater than or equal to 3. The multiple scan lines HG of the pixel array substrate 100 include a first scan line HG1 to a k-th scan line HGk sequentially arranged in the second direction y, where k is a positive integer greater than or equal to 6. For example, in the embodiment, the first scan line group $G_{HG1}$ may include the first scan line HG1, the second scan line HG2, the third scan line HG3, and the fourth scan line HG4, the scan line group $G_{HG2}$ includes the fifth scan line HG5, the sixth scan line HG6, a seventh scan line HG7, and an eighth scan line HG8, . . . , the m-th scan line group $G_{HGm}$ includes the (k-3)-th scan line HGk-3, the (k-2)-th scan line HGk-2, the (k-1)-th scan line HGk-1, and the k-th scan line HGk. However, the disclosure is not limited thereto.

The pixel array substrate 100 further includes multiple transfer line groups $G_{VG}$. Each of the transfer line groups $G_{VG}$ includes multiple transfer line VGs arranged in the first direction x. The multiple transfer lines VG of each of the transfer line groups $G_{VG}$ are electrically connected to the multiple scan lines HG of a corresponding scan line group $G_{HG}$.

In the embodiment, the multiple transfer line groups $G_{VG}$ may include a first transfer line group $G_{VG1}$, a second transfer line group $G_{VG2}$ to an m-th transfer line group $G_{VGm}$ sequentially arranged in the first direction x and respectively electrically connected to the first scan line group $G_{HG1}$, the second scan line group $G_{HG2}$ to the m-th scan line group $G_{HGm}$.

For example, in the embodiment, the first transfer line group $G_{VG1}$ may include multiple transfer lines VG1, VG2, VG3, and VG4, which are respectively electrically connected to the first scan line HG1, the second scan line HG2, the third scan line HG3, and the fourth scan line HG4 of the first scan line group $G_{HG1}$, the second transfer line group $G_{VG2}$ may include multiple transfer lines VG5, VG6, VG7, and VG8, which are respectively electrically connected to the fifth scan line HG5, the sixth scan line HG6, the seventh scan line HG7, and the eighth scan line HG8 of the second scan line group $G_{HG2}$, . . . and the m-th transfer line group $G_{VGm}$ may include multiple transfer lines VG(k-3), VG(k-2), VG(k-1), VGk, which are electrically connected to the (k-3)-th scan line HG(k-3), the (k-2)-th scan line HG(k-2), the (k-1)-th scan line HG(k-1) and the k-th scan line HGk of the m-th scan line group $G_{HGm}$.

In the embodiment, the multiple transfer lines VG may optionally belong to the second metal layer 140 (marked in FIG. 2), but the disclosure is not limited thereto.

With reference to FIG. 1, the pixel array substrate 100 further includes multiple connection terminal groups $G_S$, which are disposed on the first peripheral region 110b of the base 110. Each of the connection terminal groups GS includes multiple connection terminals S.

In the embodiment, the multiple connection terminal groups $G_S$ include a first connection terminal group $G_{S1}$, a second connection terminal group $G_{S2}$ to an m-th connection terminal group $G_{Sm}$ sequentially arranged in the first direction x, and respectively electrically connected to the first scan line group $G_{HG1}$, the second scan line group $G_{HG2}$ to the m-th scan line group $G_{HGm}$.

For example, in the embodiment, the first connection terminal group $G_{S1}$ may include a connection terminal S1, a connection terminal S2, a connection terminal S3, and a connection terminal S4 sequentially arranged in the first direction x, which are electrically connected to the first scan line HG1, the second scan line HG2, the third scan line HG3, and the fourth scan line HG4 of the scan line group $G_{HG1}$, the second connection terminal group $G_{S2}$ may include a connection terminal S5, a connection terminal S6, a connection terminal S7, and a connection terminal S8 sequentially arranged in the first direction x, which are respectively electrically connected to the fifth scan line HG5, the sixth scan line HG6, the seventh scan line HG7, and the eighth scan line HG8 of the second scan line group $G_{HG2}$, ..., the m-th connection terminal group $G_{Sm}$ may include a connection terminal S(k-3), a connection terminal S(k-2), a connection terminal S(k-1), and a connection terminal Sk sequentially arranged in the first direction x, which are respectively electrically connected to the (k-3)-th scan line HG(k-3), the (k-2)-th scan line HG(k-2), the (k-1)-th scan line HG(k-1), and the k-th scan line HGk of the m-th scan line group $G_{HGm}$.

In the embodiment, the pixel array substrate 100 further includes a scan driving circuit 150, which is electrically connected to the multiple connection terminal groups $G_S$ disposed at the first peripheral region 110b. For example, in the embodiment, the scan driving circuit 150 includes a first stage shift register to the k-th stage shift register. The connection terminal S1, the connection terminal S2, the connection terminal S3, the connection terminal S4, the connection terminal S5, the connection terminal S6, the connection terminal S7, the connection terminal S8, ..., the connection terminal S(k-3), the connection terminal S(k-2), the connection terminal S(k-1), and the connection terminal Sk are respectively electrically connected to the first stage shift register, the second stage shift register, the third stage shift register, the fourth stage shift register, and the fifth stage shift register, the sixth stage shift register, the seventh stage shift register, the eighth stage shift register, ..., the (k-3)-th stage shift register, the (k-2)-th stage shift register, the (k-1)-th stage shift register, and the k-th stage shift register.

The pixel array substrate 100 further includes multiple bridge line groups $G_b$, which are disposed on the base 110 and are structurally separated from each other. Each of the bridge line groups $G_b$ is electrically connected to a corresponding transfer line group $G_{VG}$ and a corresponding connection terminal Group $G_S$.

For example, in the embodiment, the multiple bridge line groups $G_b$ include a first bridge line group $G_{b1}$, a second bridge line group $G_{b2}$ to an m-th bridge line group $G_{bm}$ sequentially arranged in the first direction x. The first bridge line group $G_{b1}$ is electrically connected to the first transfer line group $G_{VG1}$ and the first connection terminal group $G_{S1}$, and the second bridge line group $G_{b2}$ is electrically connected to the second transfer line group $G_{VG2}$ and the second connection terminal group $G_{S2}$, ..., the m-th bridge line group $G_{bm}$ is electrically connected to the m-th transfer line group $G_{VGm}$ and the m-th connection terminal group $G_{Sm}$.

In the embodiment, the multiple bridge line groups $G_b$ may be optionally disposed on the first peripheral region 110b of the base 110, but the disclosure is not limited thereto.

With reference to FIG. 1, each of the bridge line groups $G_b$ includes multiple first bridge lines 122 extending in the first direction x and multiple second bridge lines 142 extending in the second direction y. With reference to FIGS. 1 and 2, the pixel array substrate 100 further includes an insulation layer 130, which is disposed between the first bridge lines 122 and the second bridge lines 142 of each of the bridge line groups $G_b$. In the embodiment, for example, the first bridge lines 122 belong to the first metal layer 120, the second bridge lines 142 belong to the second metal layer 140, and the insulation layer 130 is disposed between the first metal layer 120 and the second metal layer 140.

For example, in the embodiment, each of the bridge line groups $G_b$ may include multiple first bridge lines 122-1, 122-2, 122-3, 122-4 and multiple second bridge lines 142-1, 142-2, 142-3, 142-4. The first bridge line 122-1, the first bridge line 122-2, the first bridge line 122-3, and the first bridge line 122-4 are sequentially arranged in the second direction y. The second bridge line 142-1, the second bridge line 142-2, the second bridge line 142-3, and the second bridge line 142-4 are sequentially arranged in the first direction x. The second bridge line 142-1 crosses the first bridge line 122-4, the first bridge line 122-3, and the first bridge line 122-2 and is electrically connected to the first bridge line 122-1, the second bridge line 142-2 crosses the first bridge line 122-4 and the first bridge line 122-3 and is electrically connected to the first bridge line 122-2, the second bridge line 142-3 crosses the first bridge line 122-4 and is electrically connected to the first bridge line 122-3, and the second bridge line 142-4 is electrically connected to the first bridge line 122-4.

In the embodiment, the transfer line VG2 of the first transfer line group $G_{VG1}$ is electrically connected to the connection terminal S2 of the first connection terminal group $G_{S1}$ through the first bridge line 122-2 and the second bridge line 142-2 of the first bridge line group $G_{b1}$. The transfer line VG1 of the first transfer line group $G_{VG1}$ is electrically connected to the connection terminal S1 of the first connection terminal group $G_{S1}$ through the first bridge line 122-1 and the second bridge line 142-1 of the first bridge line group $G_{b1}$. The transfer line VG4 of the first transfer line group $G_{VG1}$ is electrically connected to the connection terminal S4 of the first connection terminal group $G_{S1}$ through the first bridge line 122-4 and the second bridge line 142-4 of the first bridge line group $G_{b1}$. The transfer line VG3 of the first transfer line group $G_{VG1}$ is electrically connected to the connection terminal S3 of the first connection terminal group $G_{S1}$ through the first bridge line 122-3 and the second bridge line 142-3 of the first bridge line group $G_{b1}$.

Similarly, in the embodiment, the transfer line VG6 of the second transfer line group $G_{VG2}$ is electrically connected to the connection terminal S6 of the second connection terminal group $G_{S2}$ through the first bridge line 122-2 and the second bridge line 142-2 of the second bridge line group $G_{b2}$. The transfer line VG5 of the second transfer line group $G_{VG2}$ is electrically connected to the connection terminal S5 of the second connection terminal group $G_{S2}$ through the first bridge line 122-1 and the second bridge line 142-1 of the second bridge line group $G_{b2}$. The transfer line VG8 of the second transfer line group $G_{VG2}$ is electrically connected to the connection terminal S8 of the second connection terminal group $G_{S2}$ through the first bridge line 122-4 and the second bridge line 142-4 of the second bridge line group $G_{b2}$. The transfer line VG7 of the second transfer line group $G_{VG2}$ is connected to the connection terminal S7 of the second connection terminal group $G_{S2}$ through the first bridge line 122-3 and the second bridge line 142-3 of the second bridge line group $G_{b2}$, and the rest may be deduced by analogy. For example, the transfer line VG(k-2) of the m-th transfer line group $G_{VGm}$ is electrically connected to the connection terminal S(k-2) of the m-th connection terminal group $G_{Sm}$ through the first bridge line 122-2 and the second bridge line 142-2 of the m-th bridge line group $G_{bm}$. The transfer line VG(k-3) of the m-th transfer line group $G_{VGm}$ is electrically connected to the connection terminal S(k-3) of the m-th connection terminal group $G_{Sm}$ through the first bridge line 122-1 and the second bridge line 142-1 of the m-th bridge line group $G_{bm}$. The transfer line VGk of the m-th transfer line group $G_{VGm}$ is electrically connected to the connection terminal Sk of the m-th connection terminal group $G_{Sm}$ through the first bridge line 122-4 and the second bridge line 142-4 of the m-th bridge line group $G_{bm}$. The transfer line VG(k-1) of the m-th transfer line group $G_{VGm}$ is connected to the connection terminal S(k-1) of the m-th connection terminal group $G_{Sm}$ through the first bridge line 122-3 and the second bridge line 142-3 of the m-th bridge line group $G_{bm}$.

It should be noted that the multiple connection terminals S of each of the connection terminal groups GS include a first connection terminal S to an n-th connection terminal S sequentially arranged in the first direction x, where n is a positive integer greater than or equal to 2. The multiple transfer lines VG of the corresponding transfer line group $G_{VG}$ include a first transfer line VG to an n-th transfer line VG respectively electrically connected to the first connection terminal S to the n-th connection terminal S. An arrangement sequence of the first connection terminal S to the n-th connection terminal S in the first direction x is different from an arrangement sequence of the first transfer line VG to the n-th transfer line VG in the first direction x.

For example, in the embodiment, the multiple connection terminals S of the first connection terminal group $G_{S1}$ include the first connection terminal S to the n-th connection terminal S (that is, the connection terminal S1, the connection terminal S2, the connection terminal S3, and the connection terminal S4) sequentially arranged in the first direction x. The multiple transfer lines VG of the corresponding first transfer line group $G_{VG1}$ include the transfer line VG1, the transfer line VG2, the transfer line VG3, and the transfer line VG4 respectively electrically connected to the connection terminal S1, the connection terminal S2, the connection terminal S3, and the connection terminal S4. An arrangement sequence of the connection terminal S1, the connection terminal S2, the connection terminal S3, and the connection terminal S4 in the first direction x is different from an arrangement sequence of the transfer line VG1, the transfer line VG2, the transfer line VG3, and the transfer line VG4 in the first direction x. Specifically, in the embodiment, the connection terminal S1, the connection terminal S2, the connection terminal S3, and the connection terminal S4 are sequentially arranged in the first direction x, but the transfer line VG1, the transfer line VG2, the transfer line VG3, and the transfer line VG4 respectively electrically connected to the connection terminal S1, the connection terminal S2, the connection terminal S3, the connection terminal S3, and the connection terminal S4 are arranged in a sequence of the transfer line VG2, the transfer line VG1, the transfer line VG4, and the transfer line VG3 in the first direction x.

Similarly, in the embodiment, the multiple connection terminals S of the second connection terminal group $G_{S2}$ include the connection terminal S5, the connection terminal S6, the connection terminal S7, and the connection terminal S8 sequentially arranged in the first direction x. The multiple transfer lines VG of the corresponding second transfer line group $G_{VG2}$ include the transfer line VG5, the transfer line VG6, the transfer line VG7, and the transfer line VG8 respectively electrically connected to the connection terminal S5, the connection terminal S6, the connection terminal S7, and the connection terminal S8. An arrangement sequence of the connection terminal S5, the connection terminal S6, the connection terminal S7, and the connection terminal S8 in the first direction x is different from an arrangement sequence of the transfer line VG5, the transfer line VG6, the transfer line VG7, and the transfer line VG8 in the first direction x. Specifically, in the embodiment, the connection terminal S5, the connection terminal S6, the connection terminal S7, and the connection terminal S8 are sequentially arranged in the first direction x, but the transfer line VG5, the transfer line VG6, the transfer line VG7, and the transfer line VG8 respectively electrically connected to the connection terminal S5, the connection terminal S6, the connection terminal S7, and the connection terminal S8 are arranged in a sequence of the transfer line VG6, the transfer line VG5, the transfer line VG8, and the transfer line VG7 in the first direction x.

Similarly, in the embodiment, the multiple connection terminals S of the m-th connection terminal group $G_{Sm}$ include the connection terminal S(k-3), the connection terminal S(k-2), the connection terminal S(k-1), and the connection terminal Sk sequentially arranged in the first direction x. The multiple transfer lines VG of the corresponding m-th transfer line group $G_{VGm}$ include the transfer line VG(k-3), the transfer line VG(k-2), the transfer line VG(k-1), and the transfer line VGk respectively electrically connected to the connection terminal S(k-3), the connection terminal S(k-2), the connection terminal S(k-1), and the connection terminal Sk. An arrangement sequence of the connection terminal S(k-3), the connection terminal S(k-2), the connection terminal S(k-1), and the connection terminal Sk in the first direction x is different from an arrangement sequence of the transfer line VG(k-3), the transfer line VG(k-2), the transfer line VG(k-1), and the transfer line VGk in the first direction x. Specifically, in the embodiment, the connection terminal S(k-3), the connection terminal S(k-2), the connection terminal S(k-1), and the connection terminal Sk are sequentially arranged in the first direction x, but the transfer line VG(k-3), the transfer line VG(k-2), the transfer line VG(k-1) and the transfer line VGk respectively electrically connected to the connection terminal S(k-3), the connection terminal S(k-2), the connection terminal S(k-1), and the connection terminal Sk are arranged in a sequence of the transfer line VG(k-2), the transfer line VG(k-3), the transfer line VGk, and the transfer line VG(k-1) in the first direction x.

With reference to FIGS. 1 and 2, the multiple second bridge lines 142 of each of the bridge line group $G_b$ are electrically connected to the multiple first bridge lines 122 through multiple first contact windows 132 of the insulation layer 130, and the multiple transfer lines VG of each of the transfer line groups $G_{VG}$ are electrically connected to the multiple first bridge lines 122 of a corresponding bridge line group $G_b$ through multiple second contact windows 134 of the insulation layer 130.

It should be noted that in the embodiment, the connection terminal group $G_S$, the bridge line group $G_b$, and the transfer line group $G_{VG}$ corresponding to each other are electrically connected through the multiple first contact windows 132 and the multiple second contact windows 134 of the insulation layer 130. Two of the multiple first contact windows 132 and the multiple second contact windows 134 with a furthest distance in the first direction x have a first distance DS1 in-between, and a length L1 of each of the bridge lines 122 of the bridge line groups $G_b$ is greater than or equal to the first distance DS1.

For example, in the embodiment, the first connection terminal group $G_{S1}$, the first bridge line group $G_{b1}$, and the first transfer line group $G_{VG1}$ corresponding to each other are electrically connected through the multiple first contact windows 132 and the multiple second contact windows 134 of the insulation layer 130. The two of the multiple first contact windows 132 and the multiple second contact windows 134 with the furthest distance in the first direction x are, for example, a first contact window 132 configured to connect the second bridge line 142-1 to the first bridge line 122-1 and a second contact window 134 configured to connect the first bridge line 122-3 to the transfer line VG3, a first contact window 132 configured to connect the second bridge line 142-1 to the first bridge line 122-1 and a second contact window 134 configured to connect the first bridge line 122-3 and the transfer line VG3, and have the first distance DS1 in-between in the first direction x. The length L1 of each of the first bridge lines 122-1, 122-2, 122-3, and 122-4 of the bridge line group $G_{b1}$ is greater than the first distance DS1.

In the embodiment, the length L1 of the multiple first bridge lines 122 of each of the bridge line groups $G_b$ may be substantially equal. For example, the length L1 of the first bridge line 122-1 of the first bridge line group $G_{b1}$, the length L1 of the first bridge line 122-2 of the first bridge line group $G_{b1}$, the length L1 of the first bridge line 122-3 of the first bridge line group $G_{b1}$, and the length L1 of the first bridge line 122-4 of the first bridge line group $G_{b1}$ may be substantially equal. The length L1 of the first bridge line 122-1 of the second bridge line group $G_{b2}$, the length L1 of the first bridge line 122-2 of the second bridge line group $G_{b2}$, the length L1 of the first bridge line 122-3 of the second bridge line group $G_{b2}$, and the length L1 of the first bridge line 122-4 of the second bridge line group $G_{b2}$ may be substantially equal Furthermore, in the embodiment, the length L1 of the first bridge lines 122 of the different bridge line groups Gb may be substantially equal. For example, in the embodiment, the length L1 of the first bridge line 122-1 of the first bridge line group $G_{b1}$, the length L1 of the first bridge line 122-2 of the first bridge line group $G_{b1}$, the length L1 of the first bridge line 122-3 of the first bridge line group $G_{b1}$, the length L1 of the first bridge line 122-4 of the first bridge line group $G_{b1}$, the length L1 of the first bridge line 122-1 of the second bridge line group $G_{b2}$, the length L1 of the first bridge line 122-2 of the second bridge line group $G_{b2}$, the length L1 of the first bridge line 122-3 of the second bridge line group $G_{b2}$, and the length L1 of the first bridge line 122-4 of the second bridge line group $G_{b2}$ may be substantially equal.

In the embodiment, the multiple bridge line groups $G_b$ include a first bridging line group $G_b$ and a second bridging line group $G_b$, the multiple transfer line groups $G_{VG}$ include a first transferring line group $G_{VG}$ and a second transferring line group $G_{VG}$, and the multiple scan line groups $G_{HG}$ include a first scanning line group $G_{HG}$ and a second scanning line group $G_{HG}$. The first bridging line group $G_b$, the first transferring line group $G_{VG}$, and the first scanning line group $G_{HG}$ are electrically connected. The second bridging line group $G_b$, the second transferring line group $G_{VG}$, and the second scanning line group $G_{HG}$ are electrically connected. In addition, a vertical projection of the multiple first bridge lines 122 of the first bridging line group $G_b$ on the base 110 and a vertical projection of the multiple first bridge lines 122 of the second bridging line group $G_b$ on the base 110 are substantially the same. In short, the vertical projections of the first bridge lines 122 of the different multiple bridge line groups $G_b$ on the base 110 are substantially the same.

For example, in the embodiment, the multiple bridge line groups $G_b$ include the first bridge line group $G_{b1}$ and the second bridge line group $G_{b2}$, the multiple transfer line groups $G_{VG}$ include the first transfer line group $G_{VG1}$ and the second transfer line group $G_{VG2}$, and the multiple scan line groups $G_{HG}$ include the first scan line group $G_{HG1}$ and the second scan line group $G_{HG2}$. The first bridge line group $G_{b1}$, the first transfer line group $G_{VG1}$, and the first scan line group $G_{HG1}$ are electrically connected, while the second bridge line group $G_{b2}$, the second transfer line group $G_{VG2}$, and the second scan line group $G_{HG2}$ are electrically connected. In addition, a vertical projection of the multiple first bridge lines 122 of the first bridge line group $G_{b1}$ on the base 110 and a vertical projection of the multiple first bridge lines 122 of the second bridge line group $G_{b2}$ on the base 110 are substantially the same.

In the embodiment, the multiple bridge line groups $G_b$ include the first bridging line group $G_b$ and the second bridging line group $G_b$, the multiple transfer line groups $G_{VG}$ include the first transferring line group $G_{VG}$ and the second transferring line group $G_{VG}$, and the multiple scan line groups $G_{HG}$ include the first scanning line group $G_{HG}$ and the second scanning line group $G_{HG}$. The first bridging line group $G_b$, the first transferring line group $G_{VG}$, and the first scanning line group $G_{HG}$ are electrically connected, while the second bridging line group $G_b$, the second transferring line group $G_{VG}$, and the second scanning line group $G_{HG}$ are electrically connected. In addition, a vertical projection of the multiple second bridge lines 142 of the first bridging line group $G_b$ on the base 110 and a vertical projection of the multiple second bridge lines 142 of the second bridging line group $G_b$ on the base 110 are substantially the same. In short, the vertical projections of the second bridge lines 142 of the different multiple bridge line groups $G_b$ on the base 110 are substantially the same.

For example, in the embodiment, the multiple bridge line groups $G_b$ include the first bridge line group $G_{b1}$ and the second bridge line group $G_{b2}$, the multiple transfer line groups $G_{VG}$ include the first transfer line group $G_{VG1}$ and the second transfer line group $G_{VG2}$, and the multiple scan line groups $G_{HG}$ include the first scan line group $G_{HG1}$ and the second scan line group $G_{HG2}$. The first bridge line group $G_{b1}$, the first transfer line group $G_{VG1}$, and the first scan line group $G_{HG1}$ are electrically connected, while the second bridge line group $G_{b2}$, the second transfer line group $G_{VG2}$, and the second scan line group $G_{HG2}$ are electrically connected. In addition, a vertical projection of the multiple second bridge lines 142 of the first bridge line group $G_{b1}$ on the base 110 and a vertical projection of the multiple second bridge lines 142 of the second bridge line group $G_{b2}$ on the base 110 are substantially the same.

In the embodiment, the multiple bridge line groups $G_b$ include the first bridging line group $G_b$ and the second bridging line group $G_b$, the multiple transfer line groups $G_{VG}$ include the first transferring line group $G_{VG}$ and the second transferring line group $G_{VG}$, and the multiple scan line groups $G_{HG}$ include the first scanning line group $G_{HG}$ and the second scanning line group $G_{HG}$. The first bridging line group $G_b$, the first transferring line group $G_{VG}$, and the first scanning line group $G_{HG}$ are electrically connected, while the second bridging line group $G_b$, the second transferring line group $G_{VG}$, and the second scanning line group $G_{HG}$ are electrically connected. In addition, a vertical projection of the multiple first contact windows 132 of the insulation layer 130 overlapping the first bridging line group $G_b$ on the base 110 and a vertical projection of the multiple first contact windows 132 of the insulation layer 130 overlapping the second bridging line group $G_b$ on the base 110 are substantially the same. In short, the vertical projections of the multiple first contact windows 132 overlapping the different multiple bridge line groups $G_b$ are substantially the same.

For example, in the embodiment, the multiple bridge line groups $G_b$ include the first bridge line group $G_{b1}$ and the second bridge line group $G_{b2}$, the multiple transfer line groups $G_{VG}$ include the first transfer line group $G_{VG1}$ and the second transfer line group $G_{VG2}$, and the multiple scan line groups $G_{HG}$ include the first scan line group $G_{HG1}$ and the second scan line group $G_{HG2}$. The first bridge line group $G_{b1}$, the first transfer line group $G_{VG1}$, and the first scan line group $G_{HG1}$ are electrically connected, while the second bridge line group $G_{b2}$, the second transfer line group $G_{VG2}$, and the second scan line group $G_{HG2}$ are electrically connected. In addition, a vertical projection of the multiple first contact windows 132 of the insulation layer 130 overlapping the first bridge line group $G_{b1}$ on the base 110 and a vertical projection of the multiple first contact windows 132 of the insulation layer 130 overlapping the second bridge line group $G_{b2}$ on the base 110 are substantially the same.

In the embodiment, the multiple bridge line groups $G_b$ include the first bridging line group $G_b$ and the second bridging line group $G_b$, the multiple transfer line groups $G_{VG}$ include the first transferring line group $G_{VG}$ and the second transferring line group $G_{VG}$, and the multiple scan line groups $G_{HG}$ include the first scanning line group $G_{HG}$ and the second scanning line group $G_{HG}$. The first bridging line group $G_b$, the first transferring line group $G_{VG}$, and the first scanning line group $G_{HG}$ are electrically connected, while the second bridging line group $G_b$, the second transferring line group $G_{VG}$, and the second scanning line group $G_{HG}$ are electrically connected. In addition, a vertical projection of the multiple second contact windows 134 of the insulation layer 130 overlapping the first bridging line group $G_b$ on the base 110 and a vertical projection of the multiple second contact windows 134 of the insulation layer 130 overlapping the second bridging line group $G_b$ on the base 110 are substantially the same.

For example, in the embodiment, the multiple bridge line groups $G_b$ include the first bridge line group $G_{b1}$ and the second bridge line group $G_{b2}$, the multiple transfer line groups $G_{VG}$ include the first transfer line group $G_{VG1}$ and the second transfer line group $G_{VG2}$, and the multiple scan line groups $G_{HG}$ include the first scan line group $G_{HG1}$ and the second scan line group $G_{HG2}$. The first bridge line group $G_{b1}$, the first transfer line group $G_{VG1}$, and the first scan line group $G_{HG1}$ are electrically connected, while the second bridge line group $G_{b2}$, the second transfer line group $G_{VG2}$, and the second scan line group $G_{HG2}$ are electrically connected. In addition, a vertical projection of the multiple second contact windows 134 of the insulation layer 130 overlapping the first bridge line group $G_{b1}$ on the base 110 and a vertical projection of the multiple second contact windows 134 of the insulation layer 130 overlapping the second bridge line group $G_{b2}$ on the base 110 are substantially the same.

In summary, in the embodiment, each of the bridge line groups $G_b$, the corresponding connection terminal group $G_S$, the corresponding multiple first contact windows 132 and the corresponding multiple second contact windows 134 may form a repeating unit. All the bridge line groups $G_b$, all the first contact windows 132, all the second contact windows 134, and all connection terminal groups $G_S$ of the pixel array substrate 100 may be formed by multiple of the same repeating units.

In other words, the multiple connection terminal groups $G_S$, the multiple bridge line groups $G_b$, the multiple first contact windows 132, and the multiple second contact windows 134 of the pixel array substrate 100 are in sequence, but connection manners between the multiple transfer lines VG of the multiple transfer line groups $G_{VG}$ and the multiple scan lines HG of the pixel array substrate 100 are random. Since the connection manners of the multiple transfer lines VG of the multiple transfer line groups $G_{VG}$ and the multiple scan lines HG of the pixel array substrate 100 are random, using the pixel array substrate 100 may reduce an undesirable phenomenon of diagonal stripes as described in the related art. More importantly, since the multiple connection terminal groups $G_S$, the multiple bridge line groups $G_b$, the multiple first contact windows 132, and the multiple second contact windows 134 of the pixel array substrate 100 are in sequence, the pixel array substrate 100 has a relatively simple layout design, which helps to shorten development time of the pixel array substrate 100 and reduce time required for mass production of the pixel array substrate 100.

In addition, in the embodiment, the multiple connection terminals S of each of the connection terminal groups $G_S$ include the first connecting terminal S and the second connecting terminal S. The first connecting terminal S is electrically connected to a scan line HG through a second bridge line 142 of a corresponding bridge line group $G_b$, a first bridge line 122 of the corresponding bridge line group $G_b$, and a corresponding transfer line VG. A sum of a number of first bridge lines 122 of the corresponding bridge line group $G_b$ that the second bridge line 142 crosses, a number of intersection between the second bridge line 142 and the first bridge line 122, a number of intersection between the first bridge line 122 and the transfer line VG, and a number of first bridge lines 122 of the corresponding bridge line group $G_b$ that the transfer line VG crosses is A1. The second connecting terminal S is electrically connected to another scan line HG through another second bridge line 142 of the corresponding bridge line group $G_b$, another first bridge line 122 of the corresponding bridge line group $G_b$, and another corresponding transfer line VG A sum of a number of first bridge lines 122 of the corresponding bridge line group $G_b$ that the another second bridge line 142 crosses, a number of intersection between the another second bridge line 142 and the another first bridge line 122, a number of intersection between the another first bridge line 122 and the another transfer line VG; and a number of first bridge lines 122 of the corresponding bridge line group $G_b$ that the another transfer line VG crosses is A2. A1 is equal to A2. In this way, an RC balance may be realized.

For example, in the embodiment, the multiple connection terminals S of the first connection terminal group $G_{S1}$ include the connection terminal S1 and the connection terminal S2. The connection terminal S1 is electrically connected to the scan line HG1 through the second bridge line 142-1 of the first bridge line group $G_{b1}$, the first bridge line 122-1 of the first bridge line group $G_{b1}$, and the corresponding transfer line VG1. A sum of a number of other first bridge lines 122-4, 122-3, and 122-2 of the first bridge line group $G_{b1}$ that the second bridge line 142-1 crosses (that is, 3), a number of intersection between the second bridge line 142-1 and the first bridge line 122-1 (that is, the first contact window 132 where the second bridge line 142-1 and the first bridge line 122-1 overlap is a number 1), a number of intersection between the first bridge line 122-1 and the transfer line VG1 (that is, the second contact window 134 where the first bridge line 122-1 and the transfer line VG1 overlap is a number 1) and a number of the first bridge lines 122 of the first bridge line group $G_{b1}$ that the transfer line VG1 crosses (that is, 0) is A1, where A1=3+1+1+0=5. The connection terminal S2 of the first connection terminal group $G_{S1}$ is electrically connected to another scan line HG2 through another second bridge line 142-2 of the first bridge line group $G_{b1}$, another first bridge line 122-2 of the first bridge line group $G_{b1}$, and another transfer line VG2. A sum of a number of other first bridge lines 122-4 and 122-3 of the first bridge line group $G_{b1}$ that the another second bridge line 142-2 crosses (that is, 2), a number of intersection between the another second bridge line 142-2 and the another first bridge line 122-2 (that is, the first contact window 132 where the second bridge line 142-2 and the first bridge line 122-2 overlap is a number 1), a number of intersection of the another first bridge line 122-2 and the another transfer line VG2 (that is, the second contact window 134 where the first bridge line 122-2 and the transfer line VG2 overlap is a number 1), and a number of the first bridge line 122-1 of the first bridge line group $G_b$ that the another transfer line VG2 crosses (that is, 1) is A2, where A2=2+1+1+1=5. A1 (for example, 5) is equal to A2 (for example, 5).

In addition, in the embodiment, the pixel array substrate 100 may optionally further include a multiplexer 160, which is disposed in the second peripheral region 110c of the base 110 and is electrically connected to the multiple data lines DL, but the disclosure is not limited thereto.

In the embodiment, the multiple bridge line groups $G_b$ are, for example, disposed on the first peripheral region 110b of the base 110. However, the disclosure is not limited thereto. In other embodiments, the multiple bridge line groups $G_b$ may also be disposed in the active region 110a, which is described below with reference to FIGS. 3 and 4 as examples.

It should be noted here that the following embodiments continue to use the reference numerals and part of the content of the foregoing embodiments, in which the same reference numerals are used to represent the same or similar elements, and description of the same technical content is omitted. Reference may be made to the foregoing embodiments for the descriptions of the omitted parts, which are not repeated in the following embodiments.

Figure 3:
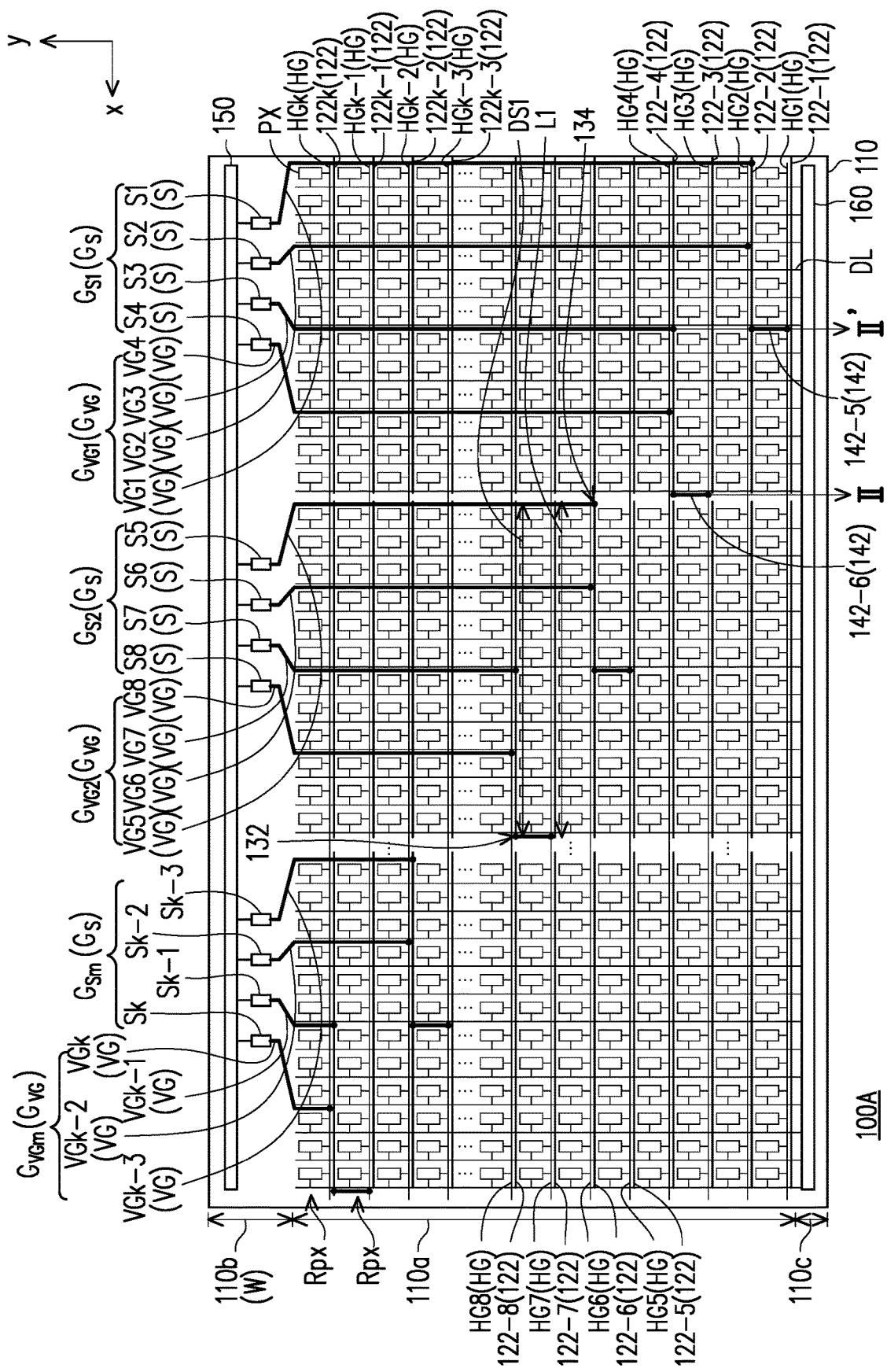
FIG. 3 is a schematic top view of a pixel array substrate 100A according to an embodiment of the disclosure.

FIG. 3 is a schematic top view of a pixel array substrate 100A according to an embodiment of the disclosure.

Figure 4:
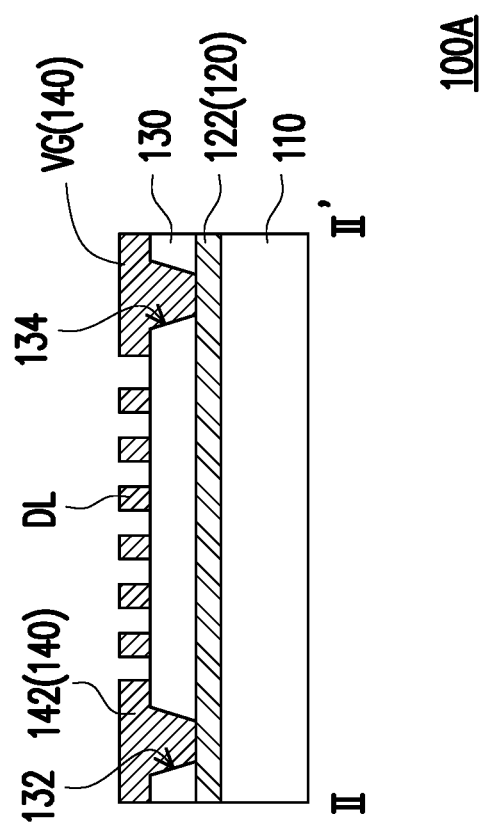
FIG. 4 is a schematic cross-sectional view of the pixel array substrate 100A according to an embodiment of the disclosure.

FIG. 4 is a schematic cross-sectional view of the pixel array substrate 100A according to an embodiment of the disclosure. FIG. 4 corresponds to a section line II-IF in FIG. 3 and shows the first metal layer 120, the insulation layer 130, and the second metal layer 140 of the pixel array substrate 100A, with omission of other layers.

Figure 5:
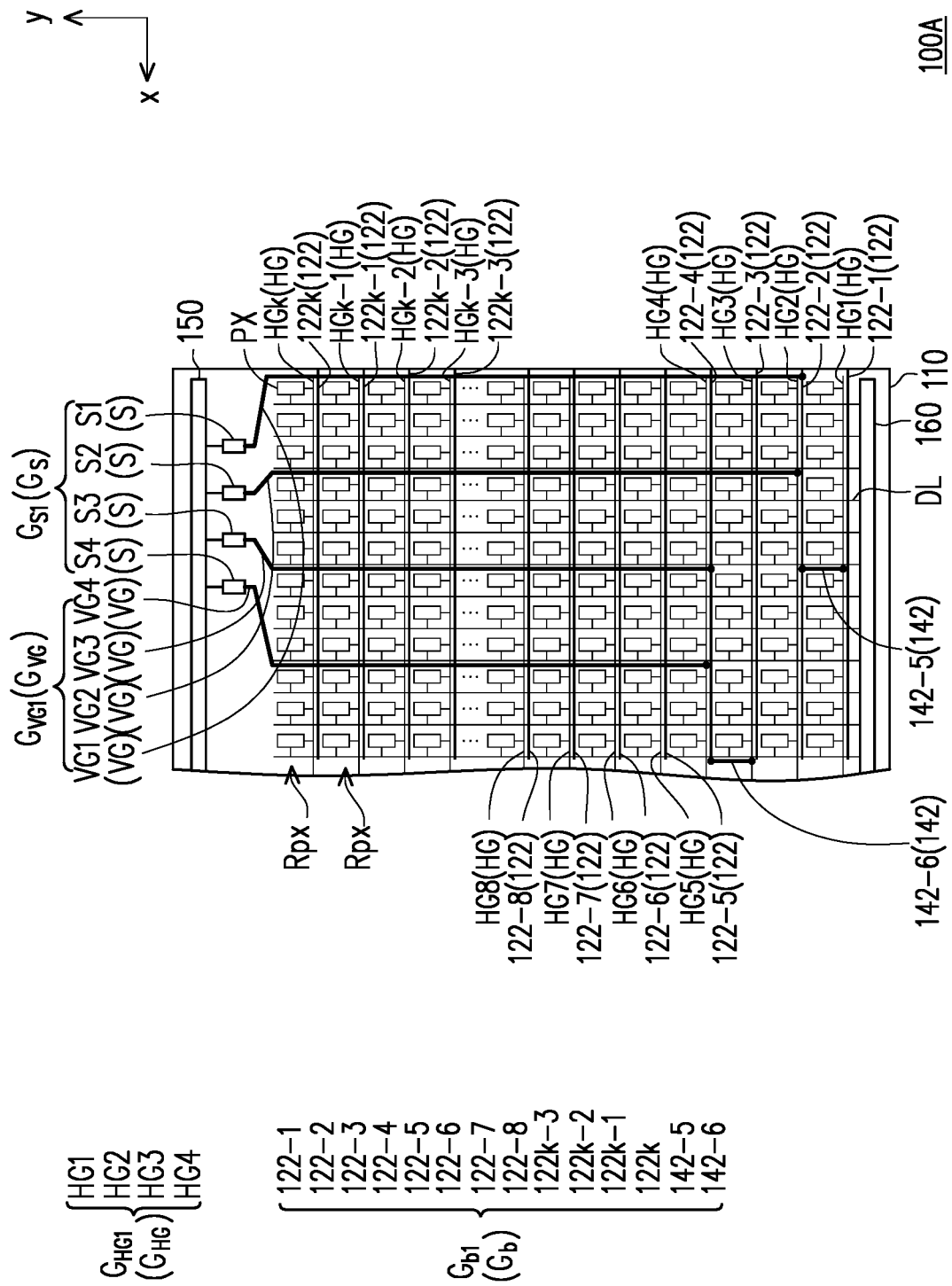
FIG. 5 shows the first scan line group $G_{HG1}$, the first transfer line group $G_{VG1}$, the first bridge line group $G_{b1}$, and the first connection terminal group $G_{S1}$ in FIG. 3.

FIG. 5 shows the first scan line group $G_{HG1}$, the first transfer line group $G_{VG1}$, the first bridge line group $G_{b1}$, and the first connection terminal group $G_{S1}$ in FIG. 3.

Figure 6:
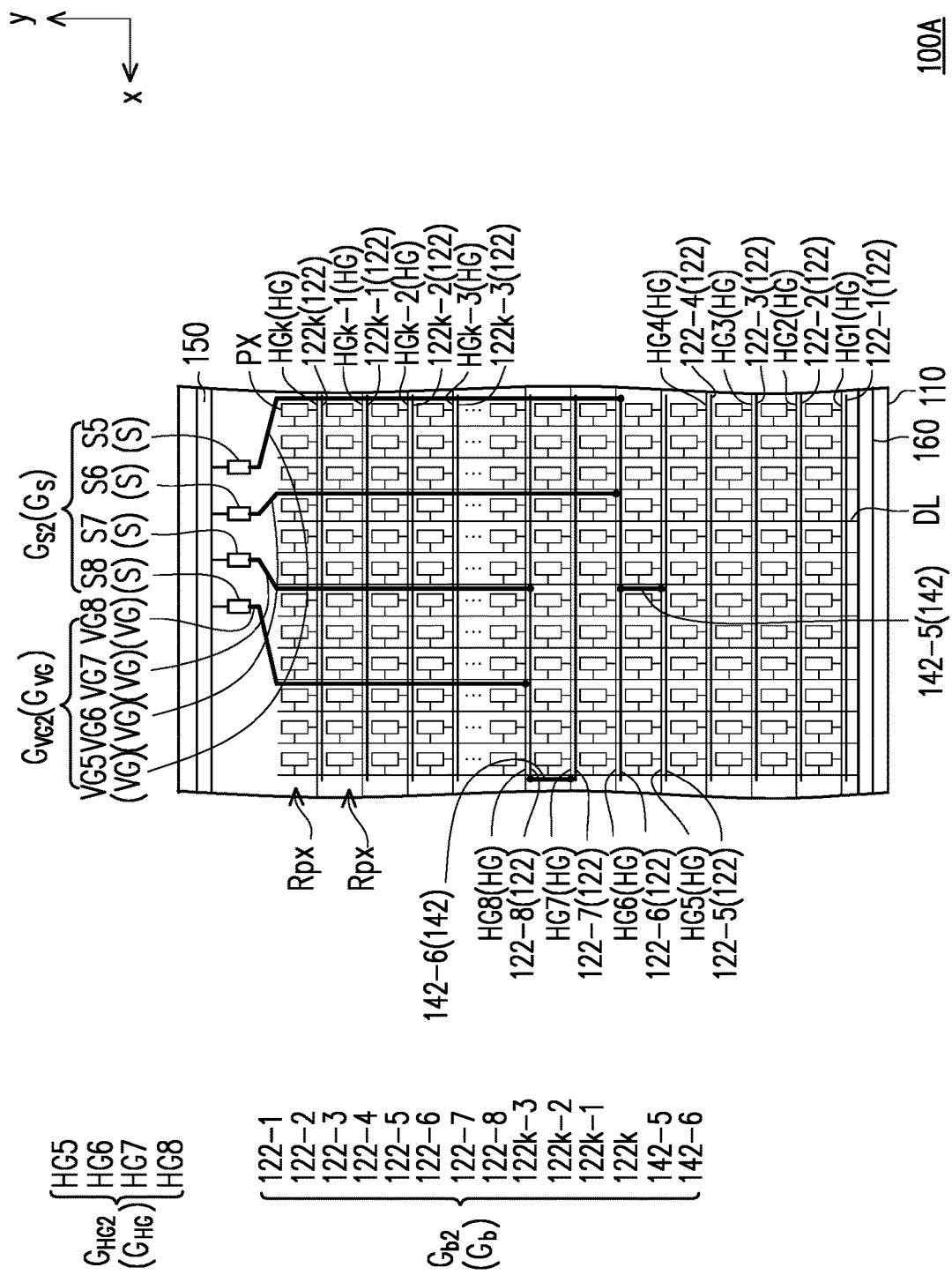
FIG. 6 shows the second scan line group $G_{HG2}$, the second transfer line group $G_{VG2}$, the second bridge line group $G_{b2}$, and the second connection terminal group $G_{S2}$ in FIG. 3.

FIG. 6 shows the second scan line group $G_{HG2}$, the second transfer line group $G_{VG2}$, the second bridge line group $G_{b2}$, and the second connection terminal group $G_{S2}$ in FIG. 3.

Figure 7:
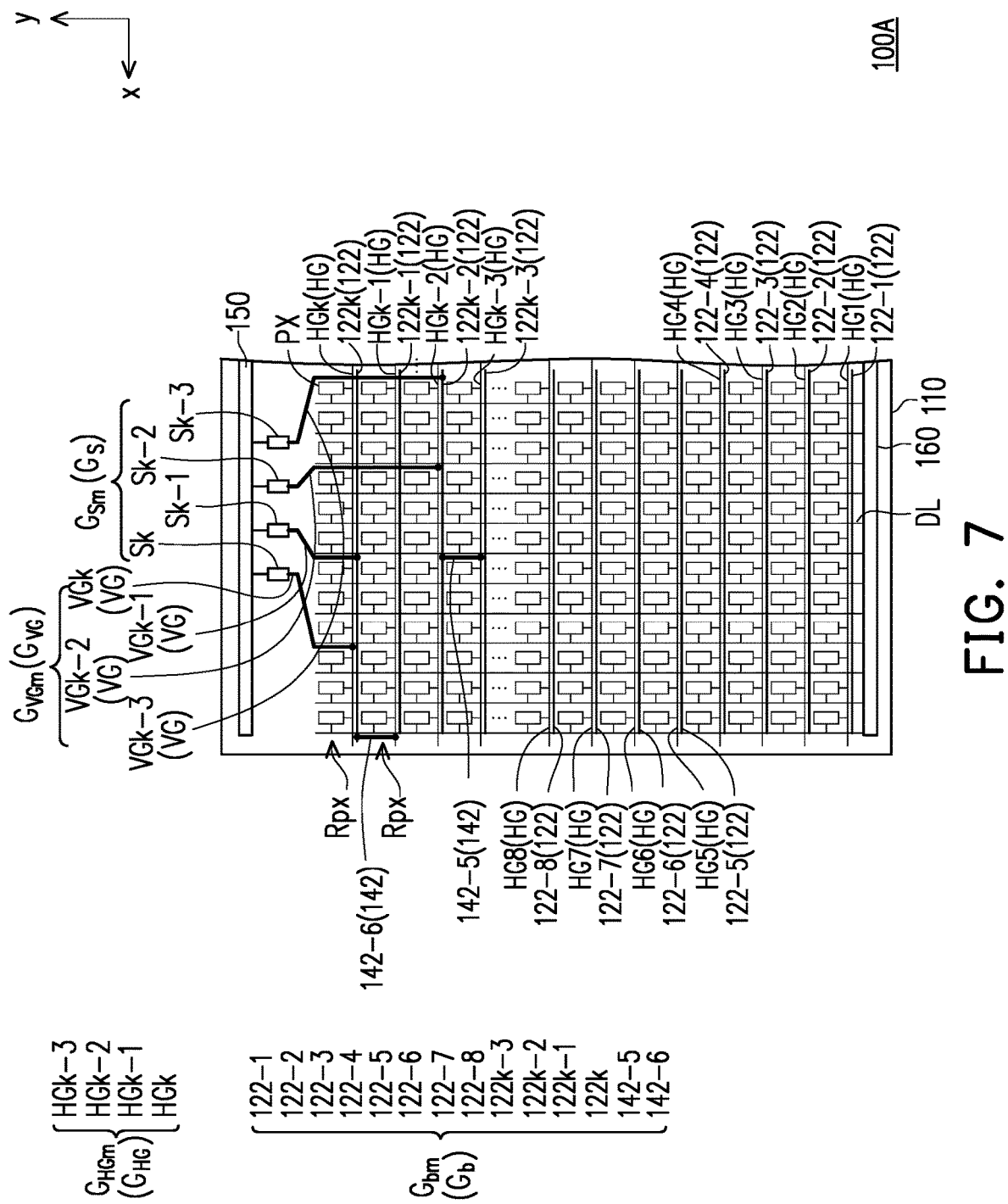
FIG. 7 shows the m-th scan line group $G_{HGm}$, the m-th transfer line group $G_{VGm}$, the m-th bridge line group $G_{bm}$, and the m-th connection terminal group $G_{Sm}$ in FIG. 3.

FIG. 7 shows the m-th scan line group $G_{HGm}$, the m-th transfer line group $G_{VGm}$, the m-th bridge line group $G_{bm}$, and the m-th connection terminal group $G_{Sm}$ in FIG. 3.

The pixel array substrate 100A of the embodiment is similar to the pixel array substrate 100 of the foregoing embodiment, and a main difference between the two is that the bridge line groups $G_b$ of the two are different.

With reference to FIGS. 3, 5, 6 and 7, in the embodiment, the multiple bridge line groups $G_b$ are disposed on the active region 110a of the base 110, and at least some of the multiple first bridge lines 122 and the multiple second bridge lines 142 of the multiple bridge line groups $G_b$ are interspersed between the multiple pixel structures PX.

Specifically, in the embodiment, the multiple pixel structures PX are arranged as multiple pixel rows Rpx, and the multiple pixel structures PX of each of the pixel rows Rpx are arranged in the first direction x. In the top view of the pixel array substrate 100A, the multiple first bridge lines 122 of each of the bridge line groups $G_b$ are respectively disposed corresponding to the multiple pixel rows Rpx. In the top view of the pixel array substrate 100A, most of the first bridge lines 122 are disposed between two adjacent pixel rows Rpx.

For example, in the embodiment, the multiple first bridge lines 122 of each of the bridge line group $G_b$ may include the first bridge line 122-1, the first bridge line 122-2, the first bridge line 122-3, the first bridge line 122-4, a first bridge line 122-5, a first bridge line 122-6, a first bridge line 122-7, a first bridge line 122-8, ..., a first bridge line 122-(k-3), a first bridge line 122-(k-2), a first bridge line 122-(k-1), and a first bridge line 122-k sequentially arranged in the second direction y. In addition, in the embodiment, the multiple second bridge lines 142 of each of the bridge line groups $G_b$ may optionally include a second bridge line 142-5 and a second bridge line 142-6.

In the embodiment, the multiple scan line groups $G_{HG}$ may include the first scan line group $G_{HG1}$, the second scan line group $G_{HG2}$ to the m-th scan line group $G_{HGm}$ sequentially arranged in the first direction x, the multiple transfer line groups $G_{VG}$ may include the first transfer line group $G_{VG1}$, the second transfer line group $G_{VG2}$ to the m-th transfer line group $G_{VGm}$ sequentially arranged in the first direction x, and the multiple bridge line groups $G_b$ include the first bridge line group $G_{b1}$, the second bridge line group $G_{b2}$ to the m-th bridge line group $G_{bm}$ sequentially arranged in the first direction x. In addition, the first scan line group $G_{HG1}$, the second scan line group $G_{HG2}$ to the m-th scan line Group $G_{HGm}$ are respectively electrically connected to the first transfer line group $G_{VG1}$, the second transfer line group $G_{VG2}$ to the m-th transfer line group $G_{VGm}$ through the first bridge line group $G_{b1}$, the second bridge line group $G_{b2}$ to the m-th bridge line group $G_{bm}$.

In the embodiment, at least two of the multiple transfer lines VG of each of the transfer line groups $G_{VG}$ are respectively electrically connected to at least two of the multiple scan lines HG of a corresponding scan line group $G_{HG}$ through at least two of the multiple first bridge lines 122 corresponding to the different pixel rows Rpx.

With reference to FIGS. 3 and 5, for example, in the embodiment, the scan line HG1 of the first scan line group $G_{HG1}$ is electrically connected to the transfer line VG1 of the first transfer line group $G_{VG1}$ through the second bridge line 142-5 and the first bridge line 122-2 of the first bridge line group $G_{b1}$, the scan line HG2 of the first scan line group $G_{HG1}$ may be directly electrically connected to the transfer line VG2 of the first transfer line group $G_{VG1}$, the scan line HG3 of the first scan line group $G_{HG1}$ is electrically connected to the transfer line VG3 of the first transfer line group $G_{VG1}$ through the second bridge line 142-6 and the first bridge line 122-4 of the first bridge line group $G_{b1}$, and the scan line HG4 of the first scan line group $G_{HG1}$ may be directly electrically connected to the transfer line VG4 of the first transfer line group $G_{VG1}$, but the disclosure is not limited thereto.

With reference to FIGS. 3 and 6, similarly, in the embodiment, the scan line HG5 of the second scan line group $G_{HG2}$ is electrically connected to the transfer line VG5 of the second transfer line group $G_{VG2}$ through the second bridge line 142-5 and the first bridge line 122-6 of the second bridge line group $G_{b2}$, the scan line HG6 of the second scan line group $G_{HG2}$ may be directly electrically connected to the transfer line VG6 of the second transfer line group $G_{VG2}$, the scan line HG7 of the second scan line group $G_{HG2}$ is electrically connected to the transfer line VG7 of the second transfer line group $G_{VG2}$ through the second bridge line 142-6 and the first bridge line 122-8 of the second bridge line group $G_{b2}$, and the scan line HG8 of the second scan line group $G_{HG2}$ may be directly electrically connected to the transfer line VG8 of the second transfer line group $G_{VG2}$, but the disclosure is not limited thereto.

With reference to FIGS. 3 and 7, similarly, in the embodiment, the scan line HG(k-3) of the m-th scan line group $G_{HGm}$ is electrically connected to the transfer line VG(k-3) of the m-th transfer line group $G_{VGm}$ through the second bridge line 142-5 and the first bridge line 122-(k-2) of the m-th bridge line group $G_{bm}$, the scan line HG(k-2) of the m-th scan line group $G_{HGm}$ may be directly electrically connected to the transfer line VG(k-2) of the m-th transfer line group $G_{VGm}$, the scan line HG(k-1) of the m-th scan line group $G_{HGm}$ is electrically connected to the transfer line VG(k-1) of the m-th transfer line group $G_{VGm}$ through the second bridge line 142-6 and the first bridge line 122-k of the m-th bridge line group $G_{bm}$, and the scan line HGk of the m-th scan line group $G_{HGm}$ may be directly electrically connected to the transfer line VGk of the m-th transfer line group $G_{VGm}$, but the disclosure is not limited thereto.

With reference to FIGS. 3, 5, 6 and 7, similar to the foregoing embodiment, the connection manners between the multiple transfer lines VG of the multiple transfer line groups $G_{VG}$ and the multiple scan lines HG of the pixel array substrate 100A are random. However, the multiple connection terminal groups $G_S$, the multiple bridge line groups $G_b$, the multiple first contact windows 132, and the multiple second contact windows 134 of the pixel array substrate 100A are in sequence. Since the connection manners of the multiple transfer lines VG of the multiple transfer line groups $G_{VG}$ and the multiple scan lines HG of the pixel array substrate 100A are random, using the pixel array substrate 100 may reduce an undesirable phenomenon of diagonal stripes as described in the related art. More importantly, since the multiple connection terminal groups $G_S$, the multiple bridge line groups $G_b$, the multiple first contact windows 132, and the multiple second contact windows 134 of the pixel array substrate 100A are in sequence, the pixel array substrate 100A has a relatively simple layout design, which helps to shorten development time of the pixel array substrate 100A and reduce time required for mass production of the pixel array substrate 100A.

With reference to FIGS. 3, 5, 6 and 7, in addition, in the embodiment, since at least some of the multiple first bridge lines 122 and the multiple second bridge lines 142 of the bridge line group $G_b$ are interspersed between the multiple pixel structures PX, a width W (marked in FIG. 3) of the first peripheral region 110b (for example, the upper frame region) may be reduced, which helps to improve aesthetics of the display device with the pixel array substrate 100A.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A pixel array substrate, comprising:
a base, having an active region and a first peripheral region outside of the active region;
a plurality of pixel structures, disposed at the active region of the base;
a plurality of data lines, electrically connected to the plurality of pixel structures and arranged in a first direction;
a plurality of scan line groups, wherein each of the scan line groups comprises a plurality of scan lines, the plurality of scan lines are arranged in a second direction, the first direction and the second direction are staggered, and the plurality of scan lines of the plurality of scan line groups are electrically connected to the plurality of pixel structures;
a plurality of transfer line groups, wherein each of the transfer line groups comprises a plurality of transfer lines, and the transfer lines are arranged in the first direction and are electrically connected to the plurality of scan lines of a corresponding scan line group;
a plurality of connection terminal groups, disposed on the first peripheral region of the base, wherein each of the connection terminal groups comprises a plurality of connection terminals;
a plurality of bridge line groups, disposed on the base and are structurally separated from each other, wherein each of the bridge line groups is electrically connected to a corresponding transfer line group and a corresponding connection terminal group; and
an insulation layer, wherein the each of the bridge line groups comprises a plurality of first bridge lines extending in the first direction and a plurality of second bridge lines extending in the second direction, the insulation layer is disposed between the plurality of first bridge lines and the plurality of second bridge lines of the each of the bridge line groups, the plurality of second bridge lines of the each of the bridge line groups are electrically connected to the plurality of first bridge lines through a plurality of first contact windows of the insulation layer, and the plurality of transfer lines of the each of the transfer line groups are electrically connected to the plurality of first bridge lines of a corresponding bridge line group through a plurality of second contact windows of the insulation layer,
wherein the connection terminal group, the bridge line group, and the transfer line group corresponding to each other are electrically connected through the plurality of first contact windows and the plurality of second contact windows of the insulation layer, two of the plurality of first contact windows and the plurality of second contact windows with a furthest distance in the first direction have a first distance in-between, and a length of each of the first bridge lines in the bridge line group is greater than or equal to the first distance,
wherein the plurality of connection terminals of the connection terminal group comprise a first connection terminal to an n-th connection terminal sequentially arranged in the first direction, where n is a positive integer greater than or equal to 2, the plurality of transfer lines of the transfer line group comprise a first transfer line to an n-th transfer line respectively electrically connected to the first connection terminal to the n-th connection terminal, and an arrangement sequence of the first connection terminal to the n-th connection terminal in the first direction is different from an arrangement sequence of the first transfer line to the n-th transfer line in the first direction.

2. The pixel array substrate according to claim 1, wherein lengths of the plurality of first bridge lines of the each of the bridge line groups are substantially equal.

3. The pixel array substrate according to claim 1, wherein the plurality of bridge line groups comprise a first bridging line group and a second bridging line group, the plurality of transfer line groups comprise a first transferring line group and a second transferring line group, and the plurality of scan line groups comprise a first scanning line group and a second scanning line group, wherein the first bridging line group, the first transferring line group, and the first scanning line group are electrically connected, while the second bridging line group, the second transferring line group and the second scanning line group are electrically connected, and a vertical projection of the plurality of first bridge lines of the first bridging line group on the base and a vertical projection of the plurality of first bridge lines of the second bridging line group on the base are substantially the same.

4. The pixel array substrate according to claim 1, wherein the plurality of bridge line groups comprise a first bridging line group and a second bridging line group, the plurality of transfer line groups comprise a first transferring line group and a second transferring line group, and the plurality of scan line groups comprise a first scanning line group and a second scanning line group, wherein the first bridging line group, the first transferring line group and the first scanning line group are electrically connected, while the second bridging line group, the second transferring line group and the second scanning line group are electrically connected, and a vertical projection of the plurality of second bridge lines of the first bridging line group on the base and a vertical projection of the plurality of second bridge lines of the second bridging line group are on the base are substantially the same.

5. The pixel array substrate according to claim 1, wherein the plurality of bridge line groups comprise a first bridging line group and a second bridging line group, the plurality of transfer line groups comprise a first transferring line group and a second transferring line group, and the plurality of scan line groups comprise a first scanning line group and a second scanning line group, wherein the first bridging line group, the first transferring line group and the first scanning line group are electrically connected, while the second bridging line group, the second transferring line group and the second scanning line group are electrically connected, and a vertical projection of the plurality of first contact windows of the insulation layer overlapping the first bridge line group on the base and a vertical projection of the plurality of first contact windows of the insulation layer overlapping the second bridge line group on the base are substantially the same.

6. The pixel array substrate according to claim 1, wherein the plurality of bridge line groups comprise a first bridging line group and a second bridging line group, the plurality of transfer line groups comprise a first transferring line group and a second transferring line group, and the plurality of scan line groups comprise a first scanning line group and a second scanning line group, wherein the first bridging line group, the first transferring line group and the first scanning line group are electrically connected, while the second bridging line group, the second transferring line group and the second scanning line group are electrically connected, and a vertical projection of the plurality of second contact windows of the insulation layer overlapping the first bridge line group on the base and a vertical projection of the plurality of second contact windows of the insulation layer overlapping the second bridge line group on the base are substantially the same.

7. The pixel array substrate according to claim 1, wherein the plurality of bridge line groups are disposed on the first peripheral region of the base.

8. The pixel array substrate according to claim 7, wherein the plurality of connection terminals of the each of the connection terminal groups comprise a first connecting terminal and a second connecting terminal, the first connecting terminal is electrically connected to a scan line through a second bridge line of a corresponding bridge line group, a first bridge line of the corresponding bridge line group, and a corresponding transfer line, a sum of a number of first bridge lines of the corresponding bridge line group that the second bridge line crosses, a number of intersection between the second bridge line and the first bridge line, a number of intersection between the first bridge line and the transfer line, and a number of first bridge lines of the corresponding bridge line group that the transfer line crosses is A1, the second connecting terminal is electrically connected to another scan line through another second bridge line of the corresponding bridge line group, another first bridge line of the corresponding bridge line group, and another corresponding transfer line, a sum of a number of first bridge lines of the corresponding bridge line group that the another second bridge line crosses, a number of intersection between the another second bridge line and the another first bridge line, a number of intersection between the another first bridge line and the another transfer line, and a number of first bridge lines of the corresponding bridge line group that the another transfer line crosses is A2, and A1 is equal to A2.

9. The pixel array substrate according to claim 1, wherein the plurality of bridge line groups are disposed on the active region of the base, and at least some of the plurality of first bridge lines and the plurality of second bridge lines of the plurality of bridge line groups are interspersed between the plurality of pixel structures.

10. The pixel array substrate according to claim 9, wherein the plurality of pixel structures are arranged as a plurality of pixel rows, the plurality of pixel structures in each of the pixel rows are arranged in the first direction, and in a top view of the pixel array substrate, the plurality of first bridge lines of the each of the bridge line groups are respectively disposed corresponding to the plurality of pixel rows.

11. The pixel array substrate according to claim 1, further comprising:
a scan driving circuit, electrically connected to the plurality of connection terminal groups disposed at the first peripheral region.

12. The pixel array substrate according to claim 11, wherein the base further has a second peripheral region, wherein the first peripheral region and the second peripheral region are respectively disposed on two opposite sides of the active region, the pixel array substrate further comprising:
a multiplexer, disposed at the second peripheral region of the base and electrically connected to the plurality of data lines.

13. A pixel array substrate, comprising:
a base, having an active region and a first peripheral region outside of the active region;
a plurality of pixel structures, disposed at the active region of the base;

a plurality of data lines, electrically connected to the plurality of pixel structures and arranged in a first direction;

a plurality of scan line groups, wherein each of the scan line groups comprises a plurality of scan lines, the plurality of scan lines are arranged in a second direction, the first direction and the second direction are staggered, and the plurality of scan lines of the plurality of scan line groups are electrically connected to the plurality of pixel structures;

a plurality of transfer line groups, wherein each of the transfer line groups comprises a plurality of transfer lines, and the transfer lines are arranged in the first direction and are electrically connected to the plurality of scan lines of a corresponding scan line group;

a plurality of connection terminal groups, disposed on the first peripheral region of the base, wherein each of the connection terminal groups comprises a plurality of connection terminals; and a plurality of bridge line groups, disposed on the base and are structurally separated from each other, wherein each of the bridge line groups is electrically connected to a corresponding transfer line group and a corresponding connection terminal group, wherein the plurality of connection terminals of each of the connection terminal groups comprise a first connection terminal to an n-th connection terminal sequentially arranged in the first direction, where n is a positive integer greater than or equal to 2, the plurality of transfer lines of a transfer line group corresponding to the each of the connection terminal groups comprise a first transfer line to an n-th transfer line respectively electrically connected to the first connection terminal to the n-th connection terminal, and an arrangement sequence of the first connection terminal to the n-th connection terminal in the first direction is different from an arrangement sequence of the first transfer line to the n-th transfer line in the first direction, wherein the first connection terminal to the n-th connection terminal of the each of the connection terminal groups comprise a first connecting terminal and a second connecting terminal, the first connecting terminal is electrically connected to a scan line through a second bridge line of a corresponding bridge line group, a first bridge line of the corresponding bridge line group, and a corresponding transfer line, a sum of a number of other first bridge lines of the corresponding bridge line group that the second bridge line crosses, a number of intersection between the second bridge line and the first bridge line, a number of intersection between the first bridge line and the transfer line, and a number of first bridge lines of the corresponding bridge line group that the transfer line crosses is A1, the second connecting terminal is electrically connected to another scan line through another second bridge line of the corresponding bridge line group, another first bridge line of the corresponding bridge line group, and another corresponding transfer line, a sum of a number of other first bridge lines of the corresponding bridge line group that the another second bridge line crosses, a number of intersection between the another second bridge line and the another first bridge line, a number of intersection between the another first bridge line and the another transfer line, and a number of first bridge lines of the corresponding bridge line group that the another transfer line crosses is A2, and A1 is equal to A2.

14. The pixel array substrate according to claim 13, wherein the plurality of bridge line groups are disposed on the first peripheral region of the base.

15. The pixel array substrate according to claim 13, further comprising:
a scan driving circuit, electrically connected to the plurality of connection terminal groups disposed at the first peripheral region of the base.

16. The pixel array substrate according to claim 15, wherein the base further has a second peripheral region, wherein the first peripheral region and the second peripheral region are respectively disposed on two opposite sides of the active region, the pixel array substrate further comprising:
a multiplexer, disposed at the second peripheral region of the base and electrically connected to the plurality of data lines.

17. A pixel array substrate, comprising:
a base, having an active region and a first peripheral region outside of the active region;
a plurality of pixel structures, disposed at the active region of the base;
a plurality of data lines, electrically connected to the plurality of pixel structures and arranged in a first direction;
a plurality of scan line groups, wherein each of the scan line groups comprises a plurality of scan lines, the plurality of scan lines are arranged in a second direction, the first direction and the second direction are staggered, and the plurality of scan lines of the plurality of scan line groups are electrically connected to the plurality of pixel structures;
a plurality of transfer line groups, wherein each of the transfer line groups comprises a plurality of transfer lines, and the transfer lines are arranged in the first direction and are electrically connected to the plurality of scan lines of a corresponding scan line group;
a plurality of connection terminal groups, disposed on the first peripheral region of the base, wherein each of the connection terminal groups comprises a plurality of connection terminals; and
a plurality of bridge line groups, disposed on the base and are structurally separated from each other, wherein each of the bridge line groups is electrically connected to a corresponding transfer line group and a corresponding connection terminal group,
wherein the plurality of connection terminals of each of the connection terminal groups comprise a first connection terminal to an n-th connection terminal sequentially arranged in the first direction, where n is a positive integer greater than or equal to 2, the plurality of transfer lines of a transfer line group corresponding to the each of the connection terminal groups comprise a first transfer line to an n-th transfer line respectively electrically connected to the first connection terminal to the n-th connection terminal, and an arrangement sequence of the first connection terminal to the n-th connection terminal in the first direction is different from an arrangement sequence of the first transfer line to the n-th transfer line in the first direction,
wherein the plurality of pixel structures are arranged as a plurality of pixel rows, the plurality of pixel structures in each of the pixel rows are arranged in the first direction, and in a top view of the pixel array substrate, the plurality of first bridge lines of the each of the bridge line groups are respectively disposed corresponding to the plurality of pixel rows.

18. The pixel array substrate according to claim 17, wherein at least two of the plurality of transfer lines of the each of the transfer line groups are respectively electrically connected to at least two of the plurality of scan lines of a corresponding scan line group through at least two of the plurality of first bridge lines corresponding to the plurality of different pixel rows.

19. The pixel array substrate according to claim 17, wherein the plurality of bridge line groups are disposed on the active region of the base, and at least some of the plurality of first bridge lines and the plurality of second bridge lines of the plurality of bridge line groups are interspersed between the plurality of pixel structures.

20. The pixel array substrate according to claim 17, further comprising:
- a scan driving circuit, electrically connected to the plurality of connection terminal groups disposed at the first peripheral region of the base.

* * * * *